United States Patent
Tanaka et al.

(10) Patent No.: US 9,859,530 B2
(45) Date of Patent: Jan. 2, 2018

(54) DISPLAY DEVICE

(71) Applicant: Japan Display Inc., Tokyo (JP)

(72) Inventors: Yuya Tanaka, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/016,385

(22) Filed: Feb. 5, 2016

(65) Prior Publication Data

US 2016/0233459 A1  Aug. 11, 2016

(30) Foreign Application Priority Data

Feb. 5, 2015  (JP) .................................. 2015-021150

(51) Int. Cl.
| | |
|---|---|
| *H01L 51/52* | (2006.01) |
| *H01L 51/05* | (2006.01) |
| *H01L 27/32* | (2006.01) |
| *H01L 51/50* | (2006.01) |

(52) U.S. Cl.
CPC ...... *H01L 51/5296* (2013.01); *H01L 27/3274* (2013.01); *H01L 51/0545* (2013.01); *H01L 51/5028* (2013.01); *H01L 51/5271* (2013.01)

(58) Field of Classification Search
CPC ............. H01L 51/5296; H01L 51/5203; H01L 51/5271; H01L 51/5028
See application file for complete search history.

(56) References Cited

U.S. PATENT DOCUMENTS

| | | | | |
|---|---|---|---|---|
| 7,138,764 B2 * | 11/2006 | Koyama | ............... | H01L 33/385 313/113 |
| 7,518,140 B2 * | 4/2009 | Suh | ..................... | H01L 27/3246 257/40 |
| 7,687,870 B2 * | 3/2010 | Fong | ............... | H01L 31/035281 257/13 |
| 7,863,628 B2 * | 1/2011 | Choi | ..................... | B82Y 20/00 257/13 |
| 8,035,298 B2 * | 10/2011 | Jeong | .................. | H01L 27/3276 313/498 |
| 8,076,733 B2 * | 12/2011 | Lee | ..................... | H01L 51/0545 257/401 |

(Continued)

FOREIGN PATENT DOCUMENTS

JP    2011-060787 A    3/2011

*Primary Examiner* — William Coleman
(74) *Attorney, Agent, or Firm* — Typha IP LLC

(57) ABSTRACT

A display device includes an organic light-emitting transistor in each of a plurality of pixels forming an image. The organic light-emitting transistor includes a source electrode 51, a drain electrode 52 spaced from the source electrode 51, an organic semiconductor layer 53 between the source electrode 51 and the drain electrode 52, and a gate electrode 50 positioned opposite the organic semiconductor layer 53. The organic semiconductor layer 53 has a portion forming the channel of the organic light-emitting transistor. The gate electrode 50 applies, to the organic semiconductor layer 53, a voltage for controlling light emission of the channel by adjusting the amount of carriers passing through the channel. The source electrode 51 and the drain electrode 52 have light-reflective surfaces between which the organic semiconductor layer 53 is sandwiched. The surfaces are inclined toward the gate electrode 50 or toward the opposite side of the gate electrode 50.

15 Claims, 15 Drawing Sheets

(56) References Cited

U.S. PATENT DOCUMENTS

| | | | |
|---|---|---|---|
| 8,497,502 B2* | 7/2013 | Yaegashi | H01L 29/7869 |
| | | | 257/43 |
| 8,999,748 B2* | 4/2015 | Jung | H01L 51/0004 |
| | | | 257/40 |
| 9,401,407 B2* | 7/2016 | Miyake | H01L 29/41733 |
| 9,535,296 B2* | 1/2017 | Jinta | H01L 51/5218 |
| 9,577,196 B2* | 2/2017 | Kim | H01L 51/003 |
| 2010/0096621 A1* | 4/2010 | Chuman | H01L 51/001 |
| | | | 257/40 |
| 2016/0141530 A1* | 5/2016 | Suga | H01L 51/0529 |
| | | | 257/66 |
| 2016/0268549 A1* | 9/2016 | Wang | H01L 51/5203 |

* cited by examiner

DISPLAY DEVICE

CROSS-REFERENCE TO RELATED APPLICATION

The present application claims priority from Japanese application JP2015-021150 filed on Feb. 5, 2015, the content of which is hereby incorporated by reference into this application.

BACKGROUND OF THE INVENTION

1. Field of the invention

The present invention relates to a display device.

2. Description of the Related Art

Some display devices, such as organic electroluminescent (EL) display devices, control self-luminous elements, such as organic light-emitting diodes (OLEDs), using switching elements, such as transistors, to display images. Use of an organic light-emitting transistor (OLET) as such a self-luminous element has been proposed. The organic light-emitting transistor is a field effect transistor (FET) whose channel is formed of an organic light-emitting layer.

JP 2011-060787 A discloses an organic light-emitting transistor array including a plurality of organic light-emitting transistors, whose gate electrode, drain electrode, source electrode, and body electrode are coupled to different lines, are arranged in a matrix.

SUMMARY OF THE INVENTION

In many cases, an organic light-emitting transistor emits less light than an organic light-emitting diode when the same degree of current flows through them, and the light-emitting efficiency of the organic light-emitting transistor is lower than that of the organic light-emitting diode. Several tens of percent of light emitted from the organic light-emitting transistor travels in a direction along a substrate but does not reach a visible side, which is one of the factors that decrease the light-emitting efficiency.

It is an object of the present invention to provide a display device that increases the lighting rate of light emitted from an organic light-emitting transistor.

A display device according to an aspect of the present invention includes an organic light-emitting transistor in each of a plurality of pixels forming an image. The organic light-emitting transistor includes a source electrode, a drain electrode spaced from the source electrode, an organic semiconductor layer between the source electrode and the drain electrode, and a gate electrode positioned opposite the organic semiconductor layer. The organic semiconductor layer has a portion forming the channel of the organic light-emitting transistor. The gate electrode applies, to the organic semiconductor layer, a voltage for controlling light emission of the channel by adjusting the amount of carriers passing through the channel. The source electrode and the drain electrode have light-reflective surfaces between which the organic semiconductor layer is sandwiched. The surfaces are inclined toward the gate electrode or toward the opposite side of the gate electrode.

DETAILED DESCRIPTION OF THE INVENTION

The following describes embodiments of the present invention with reference to the accompanying drawings. The disclosure herein is merely an example, and appropriate modifications coming within the spirit of the present invention, which are easily conceived by those skilled in the art, are intended to be included within the scope of the invention as a matter of course. In some drawings, the widths, the thicknesses, the shapes, and other characteristics of various parts are schematically shown for clarity of illustration, as compared to actual configurations. However, such schematic drawings are merely examples and are not intended to limit the present invention. In the present specification and drawings, some elements identical or similar to those previously shown are denoted by the same reference signs as the previously-shown elements, and thus are not described in detail herein as appropriate.

Figure 1:
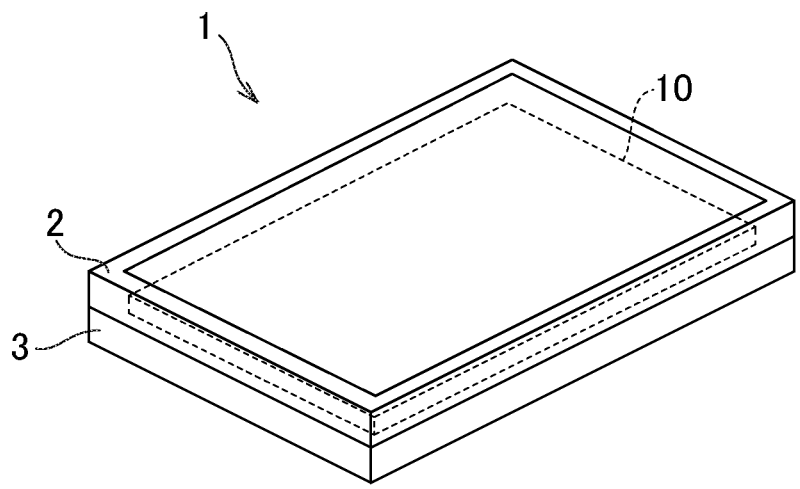
FIG. 1 is a perspective view of a display device according to an embodiment of the present invention.

FIG. 1 is a perspective view of a display device 1 according to an embodiment of the present invention. The display device 1 includes an upper frame 2, a lower frame 3, and a display panel 10 fixed between the upper frame 2 and the lower frame 3.

Figure 2:
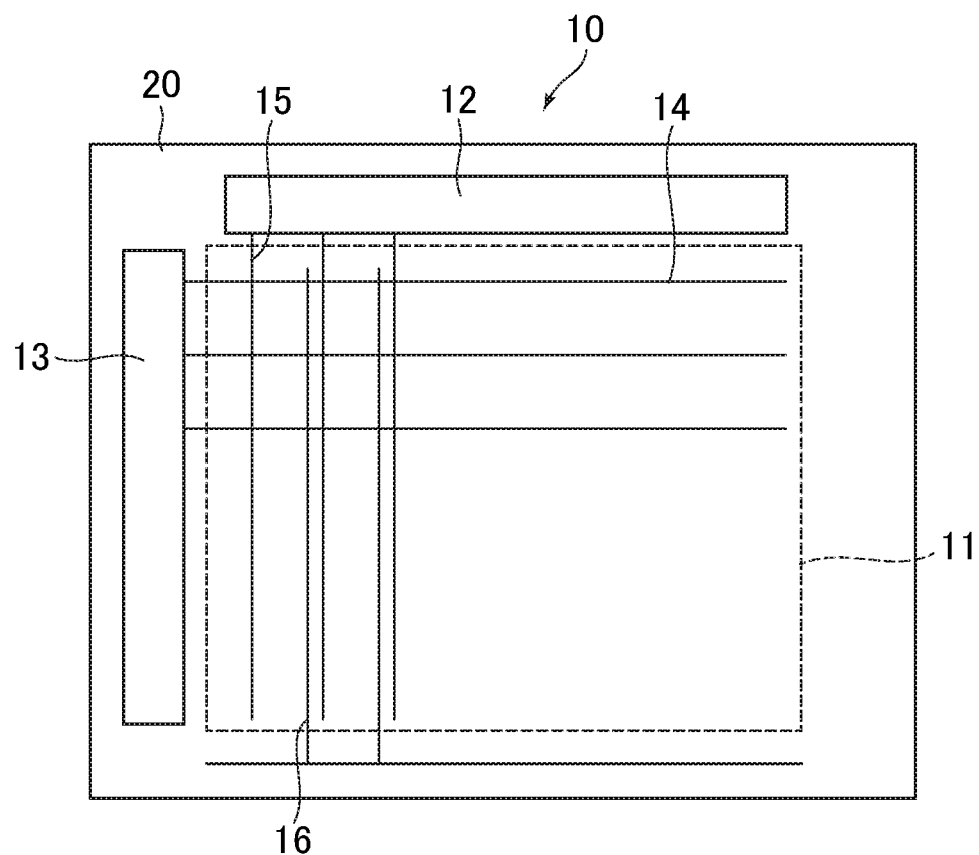
FIG. 2 is a wiring diagram of the display device according to the embodiment of the present invention.

FIG. 2 is a wiring diagram of the display device 1 according to the embodiment of the present invention. The display panel 10 controls pixels arranged in a matrix in a display area 11 by using an image signal driver circuit 12 and a scanning signal driver circuit 13, thus displaying images. The image signal driver circuit 12 is an integrated circuit (IC) that generates image signals to be sent to each pixel and sends out the image signals. The scan signal driver circuit 13 is an IC that generates scanning signals for a thin film transistor (TFT) included in each pixel and sends out the scanning signals. FIG. 2 shows the image signal driver circuit 12 and the scanning signal driver circuit 13 formed at two locations, but they may be integrated into one IC or formed at three or more separate locations.

Figure 3:
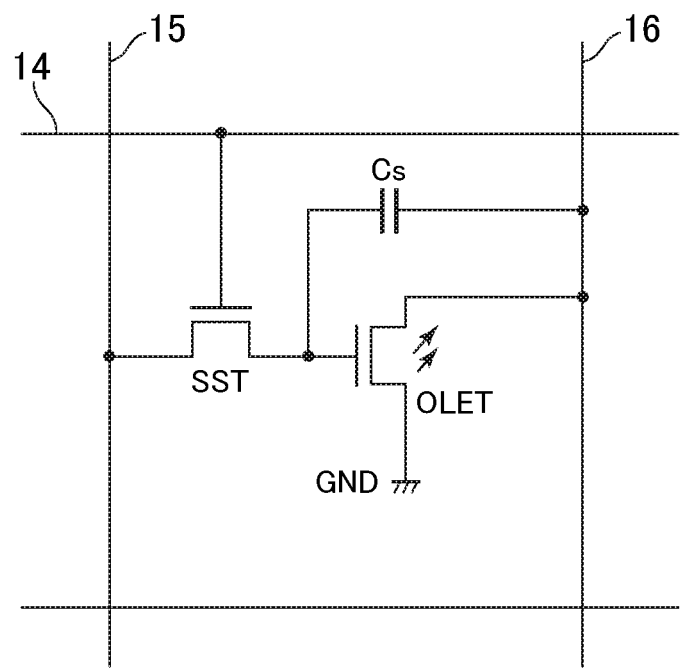
FIG. 3 is a diagram showing an equivalent circuit of a pixel of the display device according to the embodiment of the present invention.

FIG. 3 is a diagram showing an equivalent circuit of a pixel of the display device 1 according to the embodiment of the present invention. A scan line 14 that transmits signals from the scanning signal driver circuit 13 is electrically coupled to the gate of a pixel transistor SST formed in the pixel. The scan line 14 is common to pixel transistors arranged in a row. A data line 15 that transmits signals from the image signal driver circuit 12 is electrically coupled to the source of the pixel transistor SST. The data line 15 is common to pixel transistors arranged in a column. The drain of the pixel transistor SST is electrically coupled to the gate of an organic light-emitting transistor OLET and to one terminal of a storage capacitor Cs. The other terminal of the storage capacitor Cs is electrically coupled to a power line 16. The source of the organic light-emitting transistor OLET is electrically coupled to a ground line (common electrode) GND, and the drain of the organic light-emitting transistor OLET is electrically coupled to the power line 16.

A scanning signal applied to the scan line 14 switches the pixel transistor SST to an ON state. When the pixel transistor SST is in the ON state, an image signal voltage applied to the data line 15 is written to the storage capacitor Cs. The image signal voltage, which is also applied to the gate of the organic light-emitting transistor OLET, switches the organic light-emitting transistor OLET to an ON state. A power supply voltage for causing the organic light-emitting transistor OLET to emit light is applied to the power line 16, which is electrically coupled to the drain of the organic light-emitting transistor OLET. When the organic light-emitting transistor OLET is switched to the ON state, a current corresponding to the magnitude of the image signal voltage flows through the channel of the organic light-emitting transistor OLET. The channel of the organic light-emitting transistor OLET is made from a host material and a guest material that emits light. When the current flows through the channel, the recombination of holes and electrons occurs and thus excites the guest material. The quest material emits light when transitioning to a low level. The display device 1 according to this embodiment turns on or off the pixel transistor SST and the organic light-emitting transistor OLET included in each pixel through signal voltages generated by the image signal driver circuit 12 and the scanning signal driver circuit 13, thus displaying images.

A conventional organic EL display device includes, in each pixel, a pixel transistor, a driver transistor, and an organic light-emitting diode coupled to the source or the drain of the driver transistor. In the display device 1 according to this embodiment, the use of an organic light-emitting transistor, which integrates such a conventional driver transistor and a conventional organic light-emitting diode into one element, allows the circuit of each pixel to be simplified. Accordingly, the pixels can be arranged more densely, and a higher definition display device is provided. In addition, such a simplified pixel circuit allows the step of forming the display device to be simplified. Consequently, display devices can be manufactured in less time and at less cost.

Figure 4:
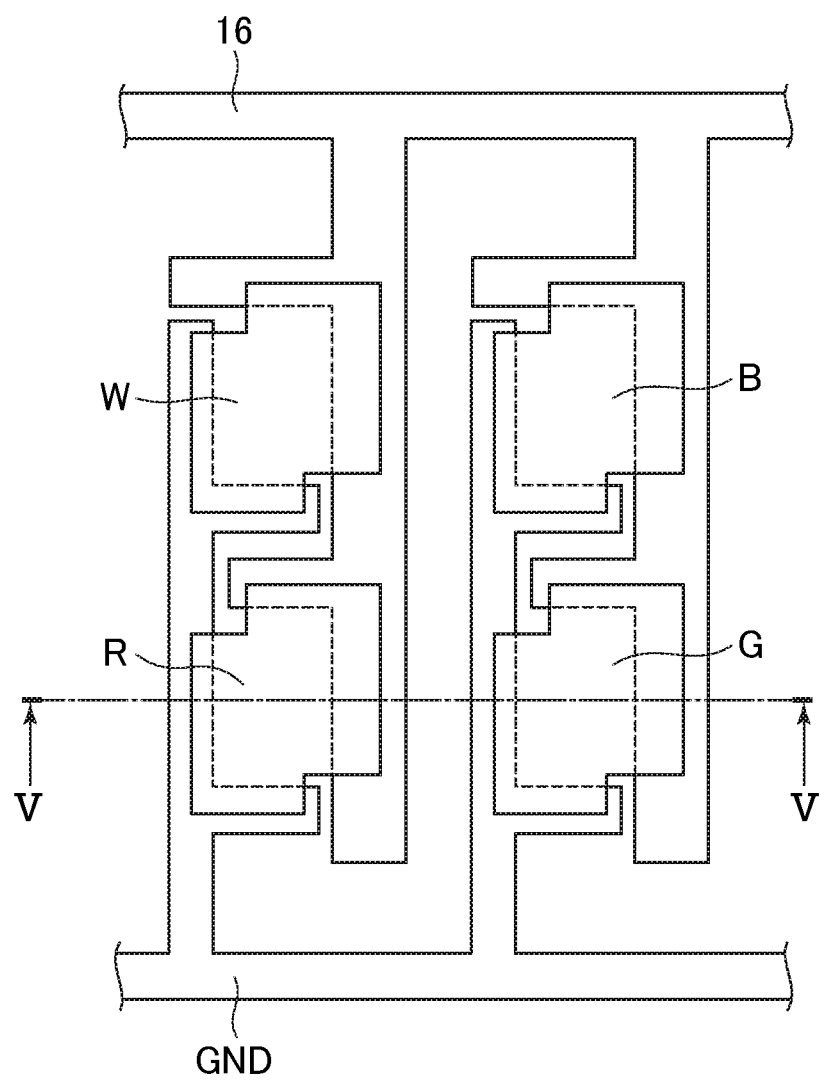
FIG. 4 is a top view of pixels of the display device according to the embodiment of the present invention.

FIG. 4 is a top view of pixels of the display device 1 according to the embodiment of the present invention. The display device 1 according to this embodiment includes an organic light-emitting transistor in each of a plurality of pixels forming an image. FIG. 4 shows an example where a white pixel W, a blue pixel B, a green pixel G, and a red pixel R together constitute one unit pixel. The luminescent color of each pixel depends on what organic materials form the channel that acts as the light-emitting portion of the corresponding organic light-emitting transistor. The power line 16 and the ground line GND are each common to the white pixel W, the blue pixel B, the green pixel G, and the red pixel R.

Figure 5:
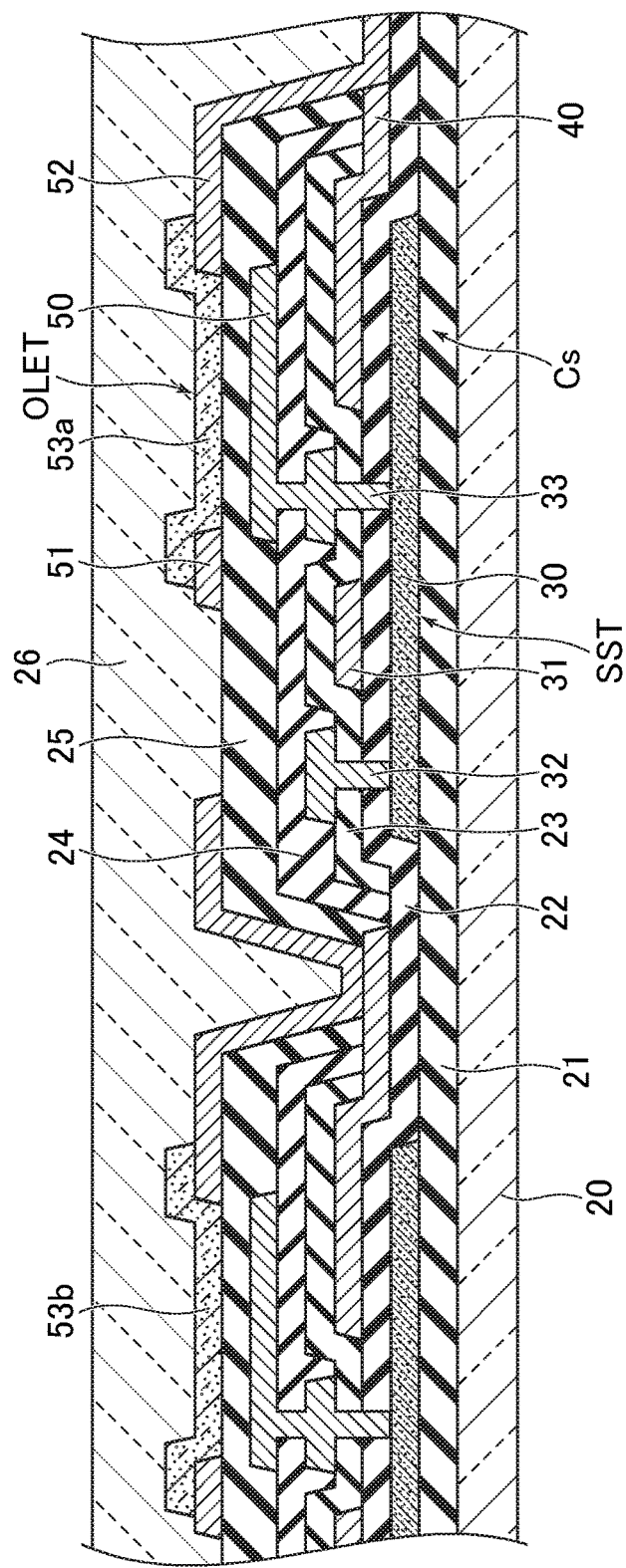
FIG. 5 is a cross-sectional view of a pixel of the display device according to the embodiment of the present invention.

FIG. 5 is a cross-sectional view of a pixel of the display device 1 according to the embodiment of the present invention. FIG. 5 shows a cross section taken along line V-V in FIG. 4. The bottom layer of the display device 1 is a substrate 20 made of, for example, glass or an synthetic resin. On the substrate 20, a first insulating layer 21 is formed of, for example, SiN or $SiO_2$. On the first insulating layer 21, a semiconductor layer 30 is formed of, for example, low-temperature polysilicon. The semiconductor layer 30 has a portion forming the channel of the pixel transistor SST. On the semiconductor layer 30 and the first insulating layer 21, a second insulating layer 22 is formed of, for example, SiN or $SiO_2$. On the second insulating layer 22, a gate electrode 31 of the pixel transistor SST is formed of metal. On the second insulating layer 22, a capacitor electrode 40 of the storage capacitor Cs is also formed of metal. The capacitor electrode 40 is formed to partially cover the semiconductor layer 30 via the second insulating layer 22 and is coupled to the power line 16 at an area not shown. On the gate electrode 31, the second insulating layer 22, and the capacitor electrode 40, a third insulating layer 23 is formed of, for example, SiN or $SiO_2$. Through holes are formed through the third insulating layer 23 and the second insulating layer 22 to the semiconductor layer 30. On the third insulating layer 23, a source electrode and a drain electrode 33 of the pixel transistor SST are formed of metal.

On the source electrode 32 and the drain electrode 33 of the pixel transistor SST and the third insulating layer 23, a fourth insulating layer 24 is formed of, for example, SiN or $SiO_2$. A through hole is formed through the fourth insulating layer 24 to the drain electrode 33 of the pixel transistor SST. On the fourth insulating layer 24, a gate electrode 50 of the organic light-emitting transistor OLET is formed of metal. On the gate electrode 50 of the organic light-emitting transistor OLET and the fourth insulating layer 24, a fifth insulating layer 25 is formed of, for example, SiN or $SiO_2$. On the fifth insulating layer 25, a source electrode 51 and a drain electrode 52 of the organic light-emitting transistor OLET are formed of metal. The source electrode 51 is coupled to the ground line GND at an area not shown. The drain electrode 52 is coupled to the power line 16 at an area not shown. An organic semiconductor layer 53 is formed in a position between the source electrode 51 and the drain electrode 52 of the organic light-emitting transistor OLET. The organic semiconductor layer 53 has a portion forming the channel of the organic light-emitting transistor OLET. In the example shown in FIG. 5, the organic semiconductor layer 53a is an organic layer containing a host material and a guest material that emits green light. The organic semiconductor layer 53b is an organic layer containing a host material and a guest material that emits red light. On the organic semiconductor layer 53, the source electrode 51, the drain electrode 52, and the fifth insulating layer 25, a sealing layer 26 is formed of, for example, an synthetic resin.

Figure 6A:
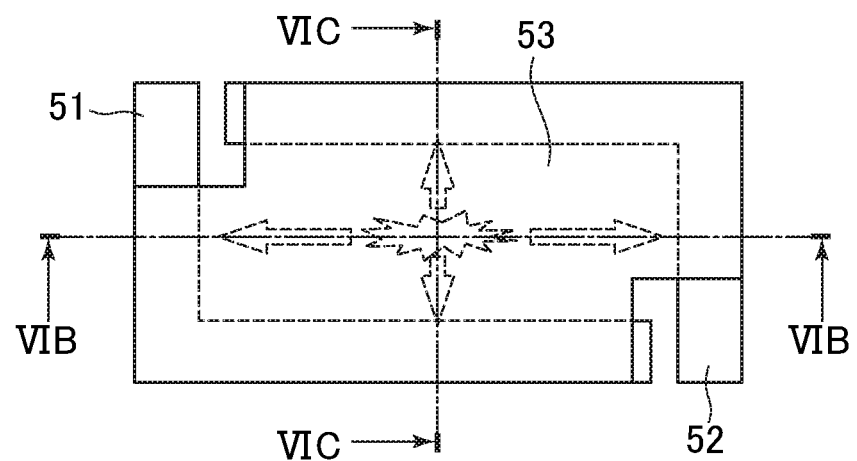
FIG. 6A is a top view of a pixel, for explaining the direction of light emitted from an organic light-emitting transistor.

FIG. 6A is a top view of a pixel, for explaining the direction of light emitted from the organic light-emitting transistor OLET. For simplicity of illustration, FIG. 6A shows only a single organic light-emitting transistor OLET and does not show the connection between the organic light-emitting transistor OLET and the power line 16, the connection between the organic light-emitting transistor OLET and the ground line GND, and the like. The organic light-emitting transistor OLET has the source electrode 51 and the drain electrode 52 spaced from the source electrode 51. The organic light-emitting transistor OLET has the organic semiconductor layer 53, which has the portion forming the channel of the organic light-emitting transistor OLET, in a position between the source electrode 51 and the drain electrode 52. The source electrode 51 and the drain electrode 52 have a shape that surrounds at least part of the organic semiconductor layer 53, in a plan view along the direction in which the gate electrode 50 faces. Specifically, the source electrode 51 and the drain electrode 52 each have an f-shape and surround at least part the organic semiconductor layer 53. The organic semiconductor layer 53 is not formed at portions (an upper-left portion and a lower-right portion in FIG. 6A) where the source electrode 51 and the drain electrode 52 are closest to each other. The reason is that the organic semiconductor layer 53 formed at the portions might cause electric field concentration and current concentration. A buffer layer may be formed at the interface between the source electrode 51 or the drain electrode 52 and the organic semiconductor layer 53. The formation of the buffer layer increases the efficiency of carrier injection. The buffer layer may be formed of a semiconductor or an insulator. When the buffer layer is formed of an insulator, carriers are injected by a quantum tunneling effect.

Figure 6B:
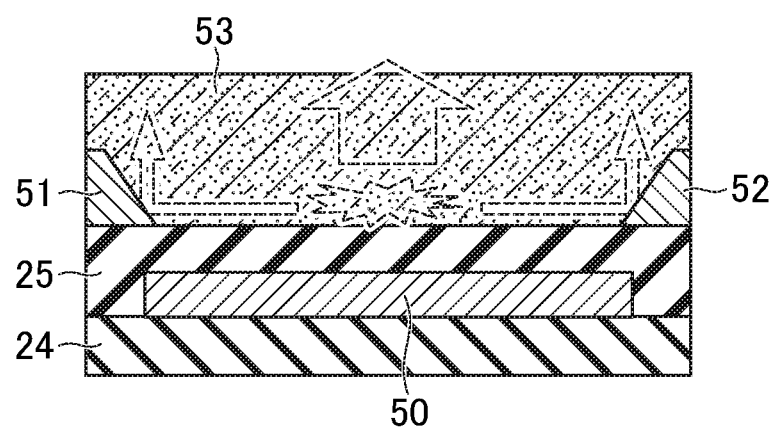
FIG. 6B is a first cross-sectional view of the pixel, for explaining the direction of light emitted from the organic light-emitting transistor.
Figure 6C:
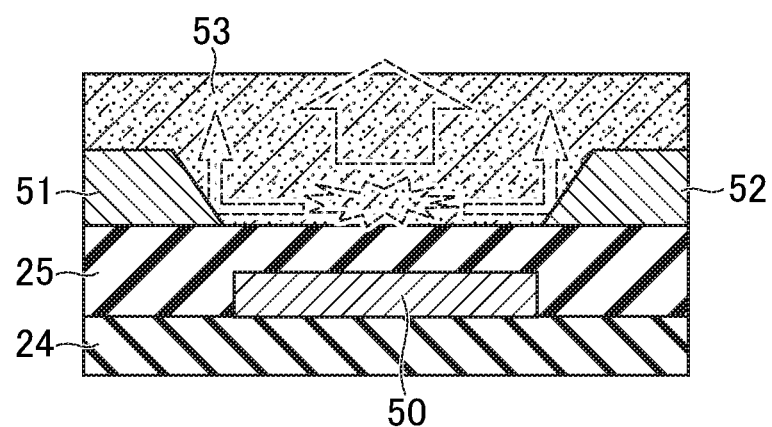
FIG. 6C is a second cross-sectional view of the pixel, for explaining the direction of light emitted from the organic light-emitting transistor.

FIG. 6B is a first cross-sectional view of the pixel, for explaining the direction of light emitted from the organic light-emitting transistor OLET. FIG. 6B is a diagram showing a cross section taken along line VIB-VIB in FIG. 6A. FIG. 6C is a second cross-sectional view of the pixel, for explaining the direction of light emitted from the organic light-emitting transistor OLET. FIG. 6C is a diagram showing a cross section taken along line VIC-VIC in FIG. 6A.

The gate electrode 50 of the organic light-emitting transistor OLET is positioned opposite the organic semiconductor layer 53 via the insulating layer 25. The gate electrode 50 applies, to the organic semiconductor layer 53, a voltage for controlling light emission of the channel by adjusting the amount of carriers passing through the channel. Specifically, the gate electrode 50 applies an image signal voltage generated by the image signal driver circuit 12 to the organic semiconductor layer 53. The source electrode 51 and the drain electrode 52 have light-reflective surfaces between which the organic semiconductor layer 53 is sandwiched. The light-reflective surfaces are inclined toward the gate electrode 50 or toward the opposite side of the gate electrode 50. In this embodiment, the source electrode 51 and the drain electrode 52 both made of metal give light reflectivity to the surfaces, between which the organic semiconductor layer 53 is sandwiched. The surfaces of the source electrode 51 and the drain electrode 52, between which the organic semiconductor layer 53 is sandwiched, are inclined toward the opposite side of the gate electrode 50. That is, the source electrode 51 and the drain electrode 52 have inclined side surfaces that faces each other across the organic semiconductor layer 53. The inclinations of these side surfaces are formed to redirect light emitted from the organic semiconductor layer 53, which is sandwiched between the source electrode 51 and the drain electrode 52, toward an observer.

In this embodiment, the gate electrode 50 is made of metal. Consequently, light that is generated in the channel of the organic semiconductor layer 53 and then emitted toward the gate electrode 50 is reflected by the gate electrode 50 and redirected toward the visible side (toward the visible side in a plan view along the direction in which the gate electrode 50 faces, that is, upward in FIGS. 6B and 6C). In this way, the light that is generated in the organic semiconductor layer 53 and then emitted toward the gate electrode 50 can also be extracted. In this embodiment, the source electrode 51 and the drain electrode are also made of metal. Consequently, light that is generated in the channel of the organic semiconductor layer 53 and then emitted in a direction along the substrate 20 is reflected by the inclined surface of the source electrode Si or the inclined surface of the drain electrode 52 and then emitted toward the visible side. In this way, light that could leak into adjacent pixels is emitted toward the visible side. As described above, the display device 1 according to this embodiment increases the lighting rate of light emitted from the organic light-emitting transistor OLET.

As shown in FIGS. 6B and 6C, in this embodiment, the source electrode 51 and the drain electrode 52, which surround the organic semiconductor layer 53, have surfaces between which the organic semiconductor layer 53 is sandwiched, and the surfaces are inclined toward the opposite side of the gate electrode 50, for all directions. Consequently, light emitted in any direction parallel to the substrate 20 is reflected by the inclined surface of the source electrode 51 or the inclined surface of the drain electrode 52 and then emitted toward the visible side. Thus, the lighting rate of light emitted from the organic light-emitting transistor OLET increases.

In this embodiment, the organic semiconductor layer 53 is made from a host material and a guest material that emits light of a single color. Alternatively, the organic semiconductor layer 53 may be made from a host material and a plurality of guest materials that emit light of a plurality of different colors. For example, three types of guest materials that emit light of red, green, and blue may be used for forming the organic semiconductor layer 53 to provide an organic light-emitting transistor that emit white light. In that case, a color filter and a black matrix may be disposed on the sealing film 26 to allow for full-color display. For a typical organic light-emitting transistor, electrons recombine with holes in a limited area. Thus, the brightness is high in the limited area but low in the other area. That is, unevenness in the brightness occurs. To correct this unevenness, the concentration of the guest material may be reduced in the area with higher brightness and may be increased in the area with lower brightness.

Figure 7A:
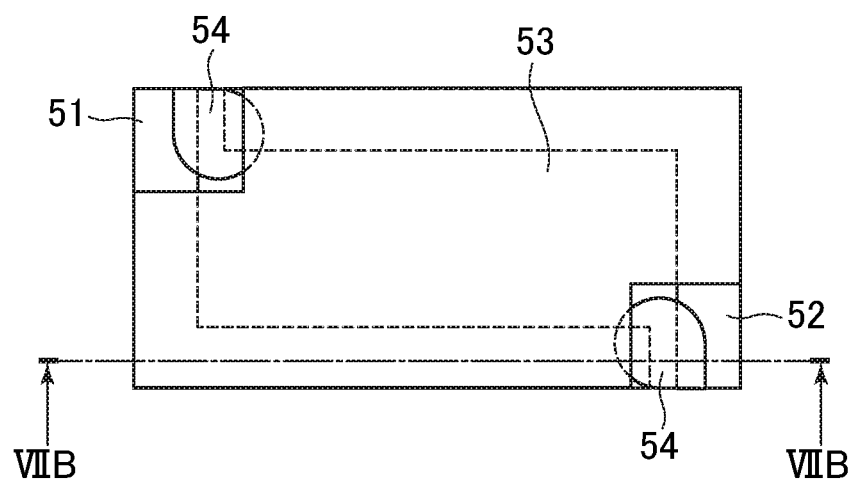
FIG. 7A is a top view of a pixel according to a first modification.

FIG. 7A is a top view of a pixel according to a first modification. This modification differs from the embodiment shown in FIG. 6A in that an inter-electrode insulating layers 54 are formed at portions (an upper-left portion and a lower-right portion in FIG. 7A) where the source electrode 51 and the drain electrode 52 are closest to each other.

Figure 7B:
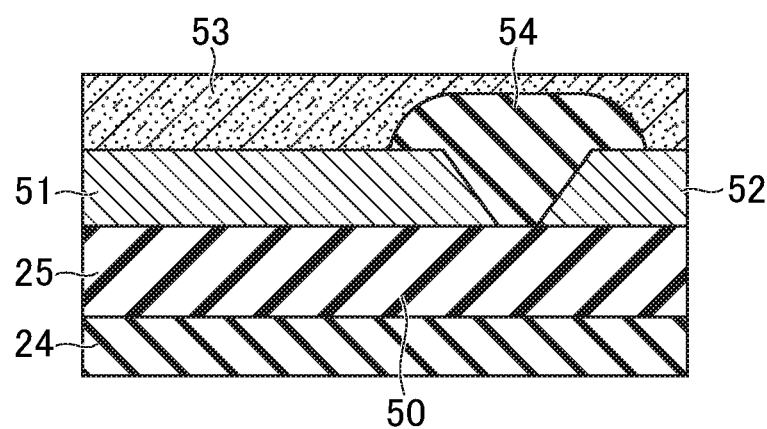
FIG. 7B is a cross-sectional view of the pixel according to the first modification.

FIG. 7B is a diagram showing a cross section taken along line VIIB-VIIB in FIG. 7A. The inter-electrode insulating layers 54 are each arranged to be sandwiched between the source electrode 51 and the drain electrode 52. This arrangement prevents electric field concentration at the portions where the source electrode 51 and the drain electrode 52 are closest to each other, thus extending the life of the display device 1. The organic semiconductor layer 53 in this modification is arranged in the region surrounded by the source electrode 51, the drain electrode 52, and the inter-electrode insulating layers 54, in a plan view (the plan view shown in FIG. 7A) along the direction in which the gate electrode 50 faces. For this modification, the inter-electrode insulating layers 54 protect the portions where the source electrode 51 and the drain electrode 52 are closest to each other, which eliminates the need for patterning the organic semiconductor layer 53 so as to avoid the portions and facilitates formation of the organic semiconductor layer 53. Accordingly, the display device 1 can be manufactured in less time and at less cost.

Figure 8A:
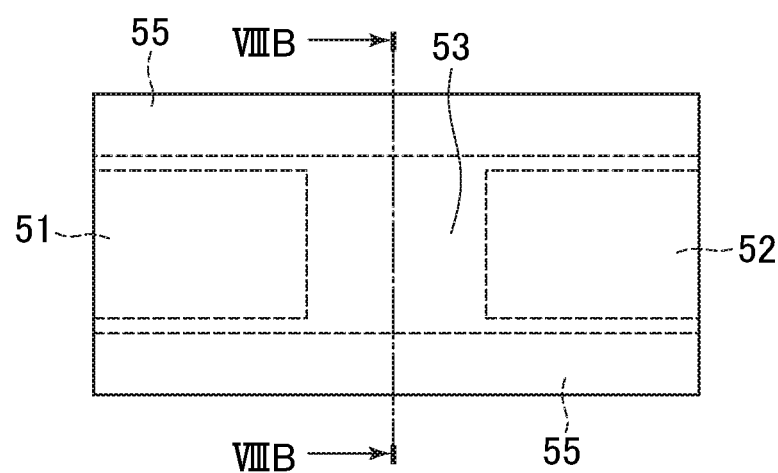
FIG. 8A is a top view of a pixel according to a second modification.

FIG. 8A is a top view of a pixel according to a second modification. This modification differs from the embodiment shown in FIG. 6A in that reflective walls 55 are provided.

The reflective walls 55 have light reflectivity and reflect light generated in the organic semiconductor layer 53 toward the visible side. Specifically, the reflective walls 55 in this modification are made of metal and thus have light reflectivity. The organic semiconductor layer 53 is arranged in the region surrounded by the source electrode 51, the drain electrode 52, and the reflective walls 55, in a plan view (the plan view shown in FIG. 8A) along the direction in which the gate electrode 50 faces. In this modification, the organic semiconductor layer 53 is formed to cover the source electrode 51, the drain electrode 52, and the reflective walls 55. The region surrounded by the source electrode 51, the drain electrode 52, and the reflective walls 55 forms the channel of the organic light-emitting transistor OLET.

The reflective walls 55 include a first reflective wall (shown in the upper part of FIG. 8A) and a second reflective wall (shown in the lower part of FIG. 8A). The first and second reflective walls are spaced from each other. In this modification, the direction from the first reflective wall to the second reflective wall is perpendicular to the direction from the source electrode 51 to the drain electrode 52. In addition, the first reflective wall and the second reflective wall are each spaced from the source electrode 51 and the drain electrode 52. In this modification, use of such a configuration keeps the distance between the source electrode 51 and the drain electrode 52 (the channel length) constant and provides a uniform light-emitting area. Moreover, unlike the embodiment shown in FIG. 6A, there is no relatively short distance between the source electrode 51 and the drain electrode 52. Thus, the organic semiconductor layer 53 can be formed on the entire surface to cover the source electrode 51, the drain electrode 52, and the reflective walls 55. Consequently, the organic semiconductor layer 53 is formed more easily and the display device 1 can be manufactured in less time and at less cost. Three or more reflective walls may be provided so that the source electrode 51, the drain electrode 52, and a plurality of reflective walls 55 surround the organic semiconductor layer 53. The direction from one of the plurality of reflective walls to another may also be freely selected.

Figure 8B:
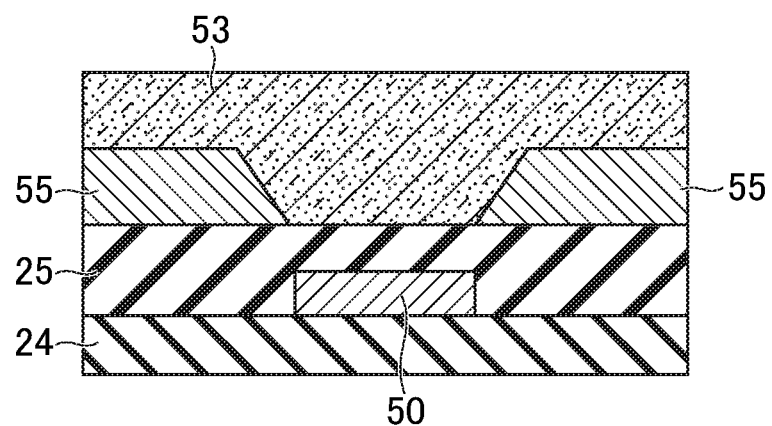
FIG. 8B is a cross-sectional view of the pixel according to the second modification.

FIG. 8B is a diagram showing a cross section taken along line VIIIB-VIIIB in FIG. 8A. In this modification, the surfaces of the source electrode 51 and the drain electrode 52, between which the organic semiconductor layer 53 is sandwiched, are inclined toward the opposite side of the gate electrode 50, and the side surfaces that the reflective walls 55 have and that are in contact with the organic semiconductor layer 53 are also inclined toward the opposite side of the gate electrode 50. Consequently, light that is generated in the organic semiconductor layer 53 and then emitted toward the reflective walls 55 is reflected by the reflective walls 55 and then emitted toward the visible side. Thus, the display device 1 according to this modification increases the lighting rate of light emitted from the organic light-emitting transistor OLET.

Figure 9A:
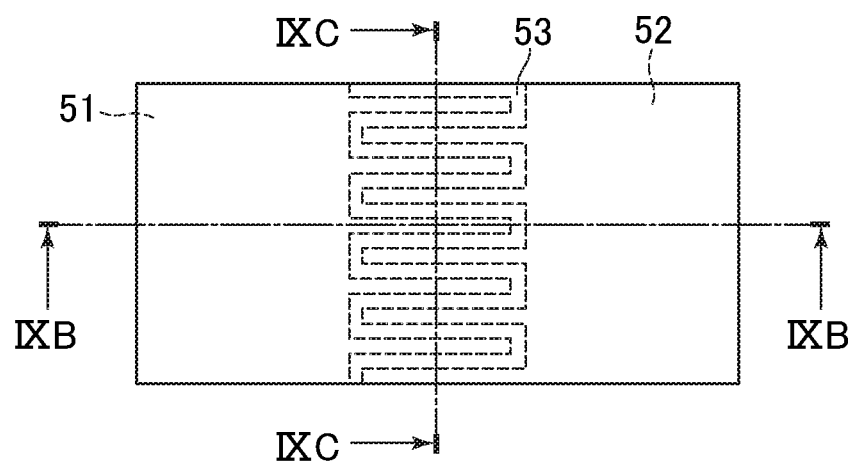
FIG. 9A is a top view of a pixel according to a third modification.

FIG. 9A is a top view of a pixel according to a third modification. This modification differs from the embodiment shown in FIG. 6A in that one of the source electrode 51 and the drain electrode 52 has a first toothed edge and that the other has a second toothed edge.

The first toothed edge of one of the source electrode 51 and the drain electrode 52 interdigitates with the second toothed edge of the other electrode. The organic semiconductor layer 53 is arrange to be sandwiched between the first and second toothed edges. In this modification, the source electrode 51 and the drain electrode 52 each have a comb-like shape and are arranged so that the first toothed edge interdigitates with the second toothed edge with a gap between each other. In this modification, the organic semiconductor layer 53 is formed to cover the source electrode 51 and the drain electrode 52. The portion of the organic semiconductor layer 53 that is sandwiched between the source electrode 51 and the drain electrode 52 forms the channel of the organic light-emitting transistor OLET. Use of such a configuration lowers the voltage (the source-drain voltage of the organic light-emitting transistor OLET, that is, the potential difference between the ground potential of the ground line GND and the power supply potential of the power line 16) required to obtain a specific brightness level, thus extending the life of the display device 1. The brightness of the organic light-emitting transistor OLET depends on the source-drain current. The source-drain current is proportional to the channel width and inversely proportional to the channel length. The source electrode 51 and the drain electrode 52 that are formed as described in this modification enable the channel width to be greater than that in the embodiment shown in FIG. 6A, thus increasing the source-drain current. The source electrode 51 and the drain electrode 52 that are formed close to each other shorten the channel length, thus also increasing the source-drain current.

Figure 9B:
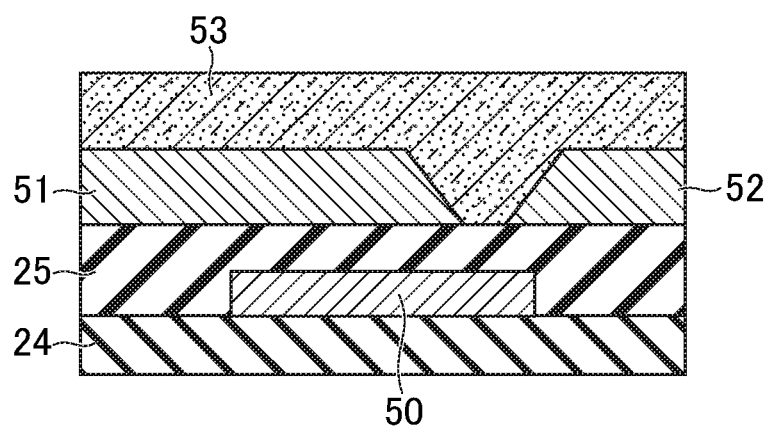
FIG. 9B is a first cross-sectional view of the pixel according to the third modification.
Figure 9C:
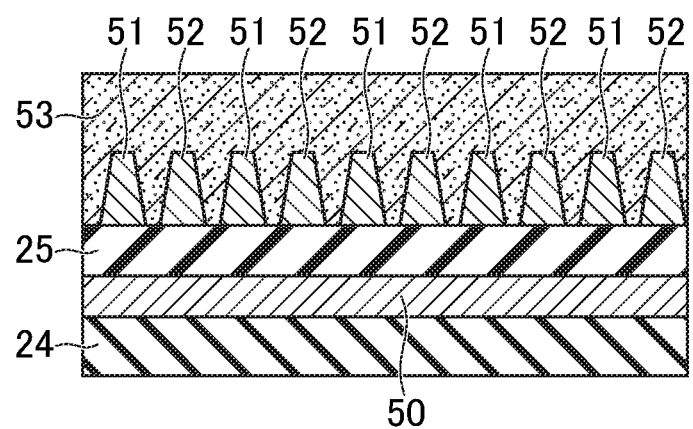
FIG. 9C is a second cross-sectional view of the pixel according to the third modification.

FIG. 9B is a diagram showing a first cross section taken along line IXB-IXB in FIG. 9A. FIG. 9C is a diagram showing a second cross section taken along line IXC-IXC in FIG. 9A. In this modification, the surfaces that the first and second toothed edges of the electrodes 51 and 52 have and between which the organic semiconductor layer 53 is sandwiched are inclined toward the opposite side of the gate electrode 50. Consequently, light that is generated in the organic semiconductor layer 53 and then emitted in any direction along the substrate 20 is reflected by the source electrode 51 or the drain electrode 52 and then emitted toward the visible side. Thus, the lighting rate of light emitted from the organic light-emitting transistor OLET increases.

Those skilled in the art can appropriately modify the design of the display device 1 described above as embodiments of the present invention and implement other display devices, and all such display devices also fall within the scope of the invention as long as they come within the spirit of the invention. For example, the surfaces of the source electrode and the drain electrode, between which the organic semiconductor layer is sandwiched, may be inclined toward the gate electrode. In that case, the gate electrode may be made of a transparent conductive material so that light generated in the organic semiconductor layer can pass out through the gate electrode.

Various other variations and modifications can be conceived by those skilled in the art within the spirit of the present invention, and it will be understood that all such variations and modifications also fall within the scope of the invention. For example, those skilled in the art can appropriately modify the above embodiments by addition, deletion, or design change of components, or by addition, omission, or condition change of steps, and all such modifications also fall within the scope of the invention as long as they come within the spirit of the invention.

It will also be understood that other effects produced by an aspect of the embodiment, which are apparent from the description herein or can be appropriately conceived by those skilled in the art, are produced by the present invention as a matter of course.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   reflective walls having light reflectivity; and
   an organic light-emitting transistor in each of a plurality of pixels forming an image, the organic light-emitting transistor comprising:
   a source electrode;
   a drain electrode spaced from the source electrode;
   an organic semiconductor layer having a light-emitting portion that is between the source electrode and the drain electrode, and that is formed at a channel of the organic light-emitting transistor; and
   a gate electrode,
   wherein
   the gate electrode and the organic semiconductor layer are positioned oppositely each other,
   the source electrode and the drain electrode each have a light-reflective surface,
   the organic semiconductor layer is sandwiched between the surfaces,
   the surfaces are inclined toward the gate electrode or toward an opposite side of the gate electrode,
   the organic semiconductor layer is arranged in a region surrounded by the source electrode, the drain electrode, and the reflective walls, in a plan view along a direction in which the gate electrode faces,
   the reflective walls each have a side surface in contact with the organic semiconductor layer,
   the side surfaces are inclined toward the opposite side of the gate electrode,
   the reflective walls include first and second reflective walls spaced from each other, and
   a direction from the first reflective wall to the second reflective wall is perpendicular to a direction from the source electrode to the drain electrode.

2. The display device according to claim 1, wherein the surfaces of the source electrode and the drain electrode, between which the organic semiconductor layer is sandwiched, are inclined toward the opposite side of the gate electrode.

3. The display device according to claim 1, wherein the source electrode, the drain electrode, and the gate electrode are made of metal.

4. The display device according to claim 1, wherein the organic semiconductor layer is made from a host material and a plurality of guest materials, and the guest materials emit light of different colors.

5. A display device comprising:
   an organic light-emitting transistor in each of a plurality of pixels forming an image, the organic light-emitting transistor comprising:
   a source electrode;
   a drain electrode spaced from the source electrode;
   an organic semiconductor layer having a light-emitting portion that is between the source electrode and the drain electrode, and that is formed at a channel of the organic light-emitting transistor; and
   a gate electrode,
   wherein
   the gate electrode and the organic semiconductor layer are positioned oppositely each other,
   the source electrode and the drain electrode each have a light-reflective surface,
   the organic semiconductor layer is sandwiched between the surfaces,
   the surfaces are inclined toward the gate electrode or toward an opposite side of the gate electrode,
   one of the source electrode and the drain electrode has a first toothed edge,
   the other electrode has a second toothed edge,
   the first toothed edge interdigitates with the second toothed edge, and
   the organic semiconductor layer is arranged to be sandwiched between the first and second toothed edges.

6. A display device comprising:
   a transistor having a first insulating layer, a semiconductor layer, a first gate electrode, a first source electrode and a first drain electrode;
   an organic light-emitting transistor in each of a plurality of pixels forming an image; and
   a second insulating layer,
   the organic light-emitting transistor comprising:
   a second source electrode;
   a second drain electrode spaced from the second source electrode;
   an organic semiconductor layer having a light-emitting portion which is between the second source electrode and the second drain electrode and is formed at a channel of the organic light-emitting transistor; and
   a second gate electrode, wherein
   the second gate electrode and the organic semiconductor layer are opposite each other,
   the second source electrode and the second drain electrode each have a light-reflective surface,
   the organic semiconductor layer is sandwiched between the surfaces,
   the surfaces are inclined toward the second gate electrode or toward an opposite side of the second gate electrode,
   the second insulating layer is on the transistor, and
   the organic light-emitting transistor is on the second insulating layer.

7. The display device according to claim 6, wherein the surfaces of the second source electrode and the second drain electrode, between which the organic semiconductor layer is sandwiched, are inclined toward the opposite side of the second gate electrode.

8. The display device according to claim 6, wherein the second source electrode, the second drain electrode, and the second gate electrode are made of metal.

9. The display device according to claim 6, further comprising
   reflective walls having light reflectivity, wherein
   the organic semiconductor layer is arranged in a region surrounded by the second source electrode, the second drain electrode, and the reflective walls, in a plan view along a direction in which the second gate electrode faces,
   the reflective walls each have a side surface in contact with the organic semiconductor layer, and
   the side surfaces are inclined toward the opposite side of the second gate electrode.

10. The display device according to claim 6, wherein
the second source electrode and the second drain electrode have a shape that surrounds at least part of the organic semiconductor layer, in a plan view along a direction in which the second gate electrode faces.

11. The display device according to claim 6, wherein
one of the second source electrode and the second drain electrode has a first toothed edge,
the other electrode has a second toothed edge,
the first toothed edge interdigitates with the second toothed edge, and
the organic semiconductor layer is arranged to be sandwiched between the first and second toothed edges.

12. The display device according to claim 6, wherein
the organic semiconductor layer is made from a host material and a plurality of guest materials, and
the guest materials emit light of different colors.

13. The display device according to claim 6, wherein
a first outer edge of the organic semiconductor layer and the second source electrode overlap each other in a first part in plan view,
a second outer edge of the organic semiconductor layer and the second drain electrode overlap each other in a second part in plan view,
the first outer edge is configured to be bent in the first part, and
the second outer edge is configured to be bent in the second part.

14. The display device according to claim 9, wherein
the reflective walls include first and second reflective walls spaced from each other, and
a direction from the first reflective wall to the second reflective wall is perpendicular to a direction from the second source electrode to the second drain electrode.

15. The display device according to claim 10, further comprising
insulating layers each arranged to be sandwiched between the second source electrode and the second drain electrode,
wherein the organic semiconductor layer is arranged in a region surrounded by the second source electrode, the second drain electrode, and the insulating layers, in the plan view.

* * * * *